(12) United States Patent
Marion

(10) Patent No.: US 7,772,041 B2
(45) Date of Patent: Aug. 10, 2010

(54) METHOD OF SEALING OR WELDING TWO ELEMENTS TO ONE ANOTHER

(75) Inventor: Francois Marion, Saint Martin le Vinoux (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/013,624

(22) Filed: Jan. 14, 2008

(65) Prior Publication Data

US 2008/0110013 A1    May 15, 2008

Related U.S. Application Data

(63) Continuation of application No. PCT/FR2006/050807, filed on Aug. 21, 2006.

(30) Foreign Application Priority Data

Aug. 30, 2005   (FR) ................................... 05 52612

(51) Int. Cl.
H01L 21/00 (2006.01)
(52) U.S. Cl. ................................ 438/118; 257/E23.193
(58) Field of Classification Search ................. 438/108, 438/125–127, 115, 118, 612, 613, 615, 619; 228/180.22; 257/E23.193
See application file for complete search history.

(56) References Cited

U.S. PATENT DOCUMENTS

| 6,008,071 | A | * | 12/1999 | Karasawa et al. | ........... 438/115 |
| 6,238,951 | B1 | | 5/2001 | Caillat | |
| 6,566,170 | B1 | | 5/2003 | Marion et al. | |
| 2005/0253282 | A1 | * | 11/2005 | Lu et al. | ........... 257/787 |

FOREIGN PATENT DOCUMENTS

FR    2 780 200 A1    12/1999

* cited by examiner

*Primary Examiner*—Matthew C Landau
*Assistant Examiner*—Jessica Hall
(74) *Attorney, Agent, or Firm*—Burr & Brown

(57) ABSTRACT

A method of sealing or welding two elements to one another in a chamber under vacuum or controlled atmosphere. The method comprises steps consisting of: producing a wettability area on opposing faces of the elements to be welded, with one of the areas comprising a layer of gold and having a surface area greater than the surface area of the other wettability area; depositing a quantity of suitable sealing material comprising indium on one of the areas; bringing the wettability area of the other element into contact with the material thus deposited; and raising the temperature of the chamber containing the elements to be welded or sealed to at least 250° C. in a non-oxidizing atmosphere, in order to seal the two elements effectively to one another by means of remelting.

6 Claims, 2 Drawing Sheets

METHOD OF SEALING OR WELDING TWO ELEMENTS TO ONE ANOTHER

FIELD OF THE INVENTION

The invention relates to the field of microelectronics, more especially to hybridization and welding techniques, in particular leakproof and hermetic hybridization and welding of a protective cover or integrated-circuit package on active electric or electronic components.

The invention therefore relates to the more general field of microcomponents, more conventionally referred to as chips, but also microsensors, microactuators such as Micro-Electro-Mechanical Systems (MEMS) etc.

DESCRIPTION OF THE PRIOR ART

The microcomponents in question dealt with in the present invention are conventionally deposited on a substrate of an appropriate nature, for example a semiconductor type substrate (monocrystalline silicon, sapphire, etc.) for electronic components.

These substrates have conductors that radiate from the microcomponent towards the periphery of the substrate in order to make it possible, above all, to process and analyze the signals that said component is expected to generate or to control the functions that it incorporates, besides making it possible to provide the required electrical power supply for the component, if applicable.

In certain cases these components are encapsulated inside a package or protective cover or equivalent type structure, thus making it possible to ensure protection again shock, corrosion, stray electromagnetic radiation, etc. This cover or package may also include a window that is transparent to the electromagnetic radiation to be detected by said component or may include one or more lenses to concentrate said radiation in the component.

Some of these microcomponents need to operate in a vacuum or in a controlled atmosphere (pressure, inert gas, etc.) or need to be sealed against the ambient atmosphere in order to work properly. Because of this, the above-mentioned package or cover is utilized in order to define a cavity above said component that encloses the controlled atmosphere or a more or less partial vacuum.

In the particular case of these encapsulated microcomponents, various technical problems are encountered during their production.

Firstly, there is the crucial issue of the quality of hermetic sealing of the connection between the cover or package and the component in order to ensure effective isolation of said component from external influences regardless of the nature of the atmosphere that is trapped within the defined space.

There is also a need to be able to control the nature of the atmosphere confined in said space because of the fact that this atmosphere spreads throughout the space prior to sealing and, generally speaking, prior to fitting the cover on the component.

Various techniques have been used hitherto in order to achieve such encapsulation of an electric or electronic component.

These include the wafer-on-wafer stacking principle. This involves topping the wafer that contains the electric or electronic component(s) with another wafer in which one or more cavities capable of defining the space to be confined have been made.

Fixing is achieved through welding, especially anodic soldering, by fusion or by sintered glass bonding. Although the principle used is satisfactory in terms of leaktightness, it does nevertheless pose several difficulties in terms of connector technology. In fact, accessing the bonding pads in order to weld the connector wires is complicated and the topologies that can be used are therefore limited. Moreover, because a high welding temperature is generally required, this limits the number of electronic components that can be implemented inside the spaces thus defined fairly drastically.

Another alternative involves producing covers by depositing thin-film layers. A cavity for an active component is formed on a wafer and then closed off by using thin-film sealing techniques. For instance, a layer is grown by Low Pressure Chemical Vapour Deposition (LPCVD) or the cavity is simply covered.

The dimensions of the cover can be reduced to the size of the active component. Although use of this technique is complex, it nevertheless has the advantage of being capable of simultaneously sealing numerous wafers comprising extremely small active components.

Finally, another technique involves welding a cover or package on a wafer by using either chip covers, i.e. each active component is given a cover, or by using a larger cover that is capable of covering several active components on a single wafer.

This technique is classically performed in several stages: it consists in aligning the cover(s) above the components, all inside a chamber capable of ensuring a controlled atmosphere or in a vacuum chamber and then sealing the cover(s) on the component(s) employing technologies familiar to those skilled in the art, using, in particular, a weld joint made of, for example, indium or a tin-lead alloy.

It is readily apparent that if a large number of operations of this type have to be performed or if a multi-component substrate is used, the installation intended to perform these operations becomes extremely complex given the fact that all these operations must be carried out inside the chamber which ensures that, as stated, a controlled atmosphere or a vacuum is maintained. In addition, such an operation is extremely time-consuming because it has to be repeated as many times as the number of covers that are to be sealed. This being so, the cost involved is considerable.

In order to optimize this duration, a solution has been proposed in document FR 2 780 200 which illustrates the use of an encapsulated electric component in one of its embodiments. The particular embodiment described is shown in FIGS. 1 and 3.

Conventional techniques are used to mount an electronic component 3 on a wafer 1 made of silicon for example. On the upper surface 4 of wafer 1 and around the periphery of the electronic component 3 there is a wettability surface or area 5 intended to accommodate a solder bead 8 made of indium or a tin-lead alloy.

This document also mentions the presence of a wedge consisting of bumps 7 that are also made of a thermofusible material, advantageously identical to that which constitutes solder bead 8 and on which a cover 2 capable of defining, together with wafer 1 and solder bead 8, the desired cavity 9 containing the controlled atmosphere or vacuum.

In order to provide, inside said cavity 9, the desired atmosphere, bumps 7 that define the wedge that supports cover 2 are located outside the solder bead, this assembly being placed inside the chamber within which there is the desired controlled atmosphere or vacuum. Simply raising the temperature is sufficient to melt the material that constitutes bumps 7 and solder bead 8, thus causing cover 2 to drop until it comes into contact with said solder bead in order to ensure leaktight closure of the cavity thus defined.

In practice, bumps 7 are also positioned on a wettability surface 6. Similarly, in order to improve contact and, above all, leaktightness, the lower face of cover 2 also has wettability surfaces 5' and 6' respectively.

This being so, using such technology makes it possible to save considerable time compared with the method described earlier. This decrease in the encapsulation time is highly significant because the time to obtain a controlled atmosphere or vacuum far exceeds the time needed to deposit the cover.

Although, at a theoretical level, the technical solution proposed by this document is highly attractive, using techniques for fitting covers using a solder bead of the cover-on-wafer type makes it necessary for the operation of effectively sealing the cover to be performed in a controlled atmosphere.

More precisely, the welding of indium on a surface made of gold requires the use of liquid or gaseous deoxidizing agents and is also referred to as submerged welding.

However, the use of welding flux is prohibited because practical experience shows that such flux results in unacceptable flux residues which cannot be cleaned at the end of welding because of the hermetic seal produced.

Moreover, when sealing or welding is performed in a vacuum, it is not possible to envisage using a flux given the fact that the latter generally outgasses when the temperature is raised in order to cause melting to produce the weld joint.

In order to produce such a fluxless weld joint, the use of thermocompression bonding in order to fit covers has also been suggested. This technique involves applying pressure at a temperature below the melting temperature of the welding material. Said material is generally located on the two sides before the welding operation.

This technique in particular is expensive and also time-consuming because the collective nature of sealing is difficult and even impossible.

The use of a stainless welding material has also been suggested in order to solve this problem.

There is a requirement for such a material to be inexpensive to use, especially with regard to the cost incurred by using a gold-tin AuSn alloy and, in addition, for the mechanical properties of the final structure to ensure excellent reliability of the finished device which must be capable, in particular, of withstanding temperature excursions. There is also a requirement to eliminate outgassing caused by the possible presence of welding flux residues.

Gold-tin alloy has a high Young's modulus and is therefore not satisfactory for this requirement in terms of its mechanical properties.

In other words, neither known technologies nor known materials according to the prior art make it possible to achieve the sought-after objective of the present invention.

SUMMARY OF THE INVENTION

The present invention therefore relates to a method of welding or sealing which is both inexpensive to use and ensures optimal reliability of the finished component.

This method of welding or sealing two elements to one another in a chamber under vacuum or controlled atmosphere consists in:
  producing a wettability area on the opposing faces of the elements to be welded which is also referred to as a bonding surface;
  depositing a quantity of suitable sealing material on one of the areas;
  bringing the wettability area of the other element into contact with the material thus deposited;
  raising the temperature of the chamber containing the elements to be welded or sealed until at least the melting temperature of the sealing material is reached in order to seal the two elements effectively to one another by means of remelting.

According to the invention:
  the wettability area of the element on which the sealing or welding material was not deposited consists of a layer of gold;
  the surface area of the wettability area of the element positioned not in contact with the sealing material is greater than the surface area of the wettability area on which said material, the underbump metallization (UBM) layer, is deposited;
  the sealing material consists of indium;
  and melting of said sealing material in order to achieve sealing of the two elements effectively to one another occurs at a temperature in excess of 250° C. in a non-oxidizing atmosphere and advantageously in excess of 300° C.

In other words, the invention involves using these four cumulative conditions which make it possible to use a bead of indium as the sealing material, the raw material costs of which are, as is known, much less than those of gold-tin alloy, typically 10 times lower.

In addition, the invention involves causing melting of the sealing material at a temperature well above the effective melting temperature of indium. In fact, although the melting temperature of indium is 156° C., the temperature recommended by the invention for producing sealing is 250° C. or even 300° C., i.e. 1.6 times the melting temperature of indium.

This eliminates the need to use flux to ensure sealing and the drawbacks which this involves while making it possible to use indium, the other properties of which are highly rated for producing an effective solder bead.

Indium is a soft or relatively ductile material and its mechanical properties make it possible to:
  drastically relieve the post-welding stresses between the assembled elements;
  obtain enhanced reliability compared with gold-based solders, especially in relation to the thermal cycling to which detectors which use such technology are subjected, it being well known that thermal cycling produces shear forces and hence rapid failures because of differences in the thermal expansion coefficients of the materials used.

According to one advantageous aspect of the invention, the surface area of the wettability area, especially its width in the case of tape, of the element positioned on the sealing material is at least one and a half times greater than that of the surface area or corresponding dimension of the underlying UBM wettability area.

According to another advantageous aspect of the invention, the remelting temperature which ensures sealing of the two elements effectively to one another is higher than 300° C.

BRIEF DESCRIPTION OF THE DRAWINGS

The way in which the invention is implemented and its resulting advantages will be made more readily understandable by the descriptions of the following embodiments, given merely by way of example, reference being made to the accompanying drawings.

As already stated.

DETAILED DESCRIPTION OF THE INVENTION

Figure 1:
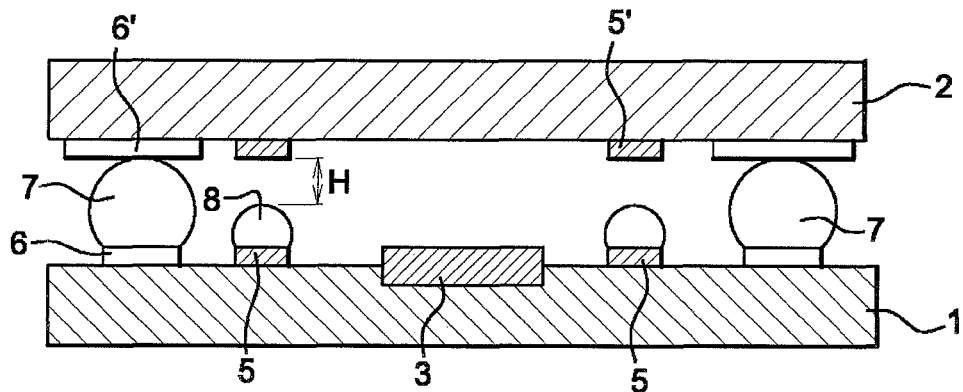
FIGS. 1, 2 and 3 show the prior art, FIGS. 1 and 3 showing schematic cross-sectional views of a substrate and a cover prior to and after the increase in temperature, respectively, that causes remelting of the sealing bead, FIG. 2 being a schematic view of the upper face of the substrate.
Figure 2:
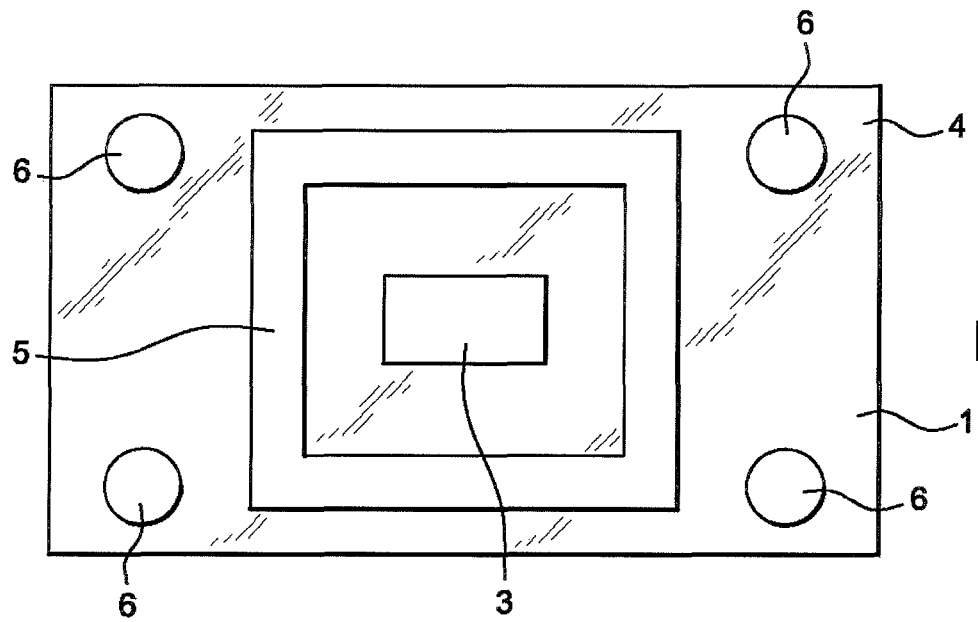
Figure 3:
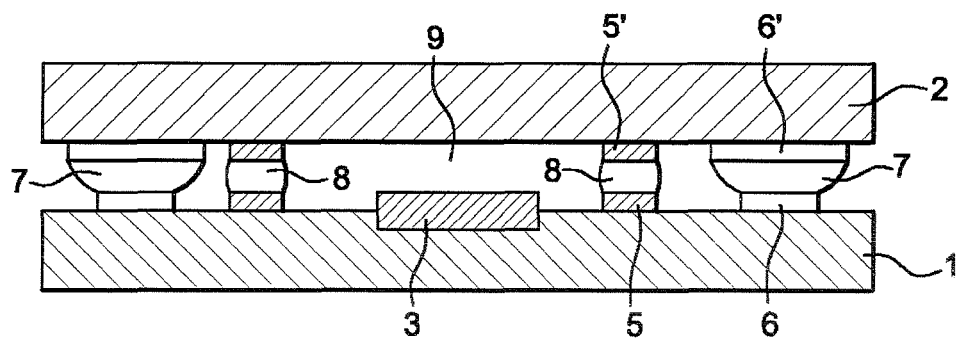
Figure 4:
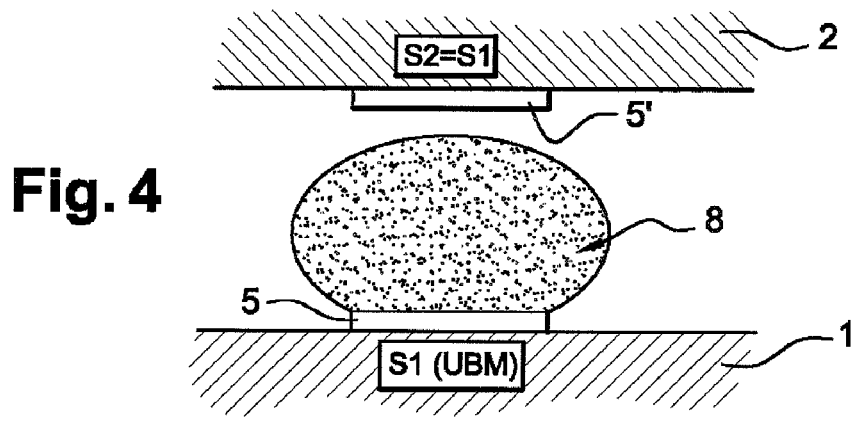
FIG. 4 is also a cross-sectional view of a detail according to the prior state of the art.

FIG. 4 is a cross-sectional view intended to show the prior state of the art in greater detail.

It is clear that surface areas S1 and S2 respectively of underbump metallization (UBM) layer 5 on substrate 1 and of the wettability area 5' on the lower face of the cover have substantially the same dimensions. In this example, solder bead 8 or, generally speaking, the sealing material consists of a gold-tin alloy AuSn.

The drawbacks associated with using such a sealing material have already been extensively discussed above and there is no need to explain them again in detail.

Figure 5:
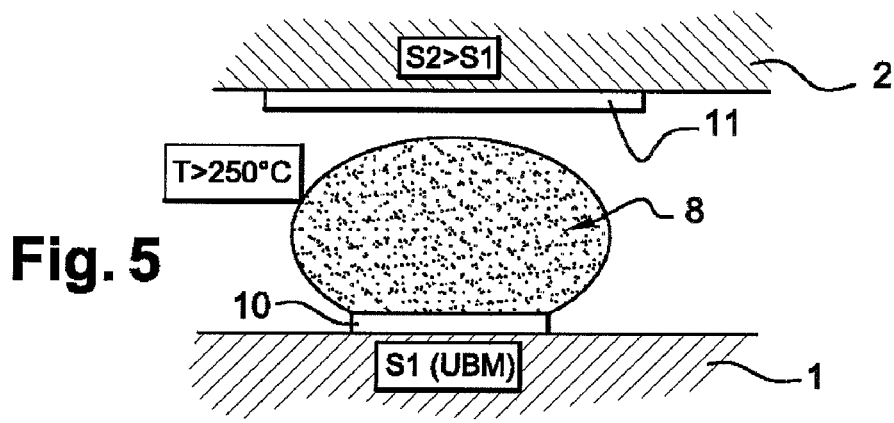
FIG. 5 is a schematic cross-sectional view of a detail of the general principle of the invention and FIG. 6 is a schematic cross-sectional view of a cover before it is sealed on a wafer.
Figure 6:
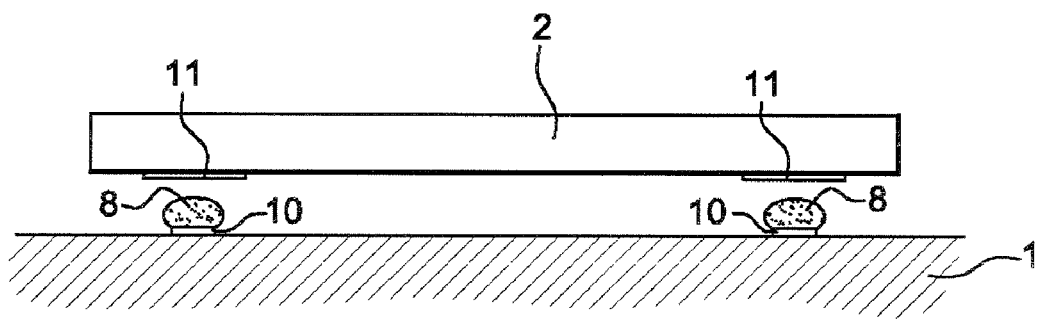

FIG. 5 which shows the invention aims to very clearly indicate the various distinctive features of the invention.

Here too, wettability areas 10 and 11 are used. In the present invention however, these wettability areas consist of gold, to the exclusion of any other material. These layers of gold on the top layer which acts as a barrier layer while the bonding surface and is typically made of a titanium-based alloy such as TiNi, TiW, TiPd, etc.

These areas are produced conventionally using technologies which are perfectly familiar to those skilled in the art and there is no need to describe them here in detail.

However and according to one of the aspects of the invention, the dimensions of wettability area 10 which receives solder bead 8 and area 11 produced on cover 2 respectively have a different geometry.

Moreover and according to another aspect of the invention, the sealing material consists of indium to the exclusion of any other material.

This material is deposited by any means such as evaporation, screen printing, electrolysis or even using the so-called metallic printing or stamping technique described in the patent application filed on the same day as this application.

To sum up, this technology makes it possible to achieve considerable reductions in the costs associated with depositing the sealing or welding material by eliminating any photomasking stage while making it possible to use all available full wafer solder deposition techniques.

After deposition, the layer of indium can be reshaped in a deoxidizing flux. This is done at a temperature higher than the melting temperature of indium and hence above 156° C. and advantageously above 170° C.

This layer of indium is deposited on wettability area 10 made of gold, platinum or another noble material having surface area S1, in this case width S1.

In contrast, wettability area 11 which is made of gold to a limited extent on the lower face of cover 2 has surface area S2, in this case it is a tape having a width S2 which is greater than width S1 of metallization area 10 and is typically more than one and a half times the latter.

The operation to seal cover 2 on substrate 1 is performed by remelting at a temperature above 250° C. This temperature is advantageously above 300° C. and the operation is performed in a non-oxidizing atmosphere, typically in a vacuum or an inert gas.

This high temperature allows continuous formation of gold-indium intermediate binary compounds capable of keeping the materials of the contact area between solder bead 8 or solder bumps 7 in a molten state during the welding process, thus favouring a hermetic seal.

This provides low-cost sealing with improved mechanical properties which therefore enhance the reliability of the resulting detector and also make it possible to obtain collective hermetic sealing by using self-aligning cover technology to apply as described in Document FR 2 780 200 cited above.

This way one can fit covers on bolometers built on a silicon wafer and fit covers on optoelectronic components in nitrogen.

It is possible, as disclosed in the above-mentioned document, to obtain, simultaneously, connection using solder bumps (using flipchip technology) and peripheral hermetic sealing by means of a solder bead.

This technology therefore makes it possible to fit covers on numerous components made on a single semiconductor wafer collectively and simultaneously. It also makes it possible to obtain hybridization of multiple chip modules without the need for cleaning any flux and without any time limit intimately associated with this.

By way of example, the invention makes it possible to produce infrared detector arrays of bolometric detectors in a vacuum on a CMOS wafer by fitting covers which are transparent to infrared radiation, possibly equipped with getter layers. The production of hybrid optical components on a silicon bed with hermetically sealed covers and, if applicable, optics and/or interconnections implemented on the cover also deserves mention. Finally, one should mention the production of MEMS collectively fitted with covers in a vacuum on a CMOS wafer by fitting covers, possibly equipped with getter layers.

The invention claimed is:

1. A method of joining two elements to one another, comprising:
   forming a first wettability area on one of the elements;
   depositing a sealing material on said first wettability area, said sealing material consisting of indium;
   forming a second wettability area on the other one of the elements, said second wettability area consisting of a layer of gold and having a surface area that is greater than a surface area of said first wettability area;
   bringing said second wettability area into contact with said sealing material; and
   heating the elements in a chamber in a non-oxidizing atmosphere and in the absence of any gaseous or liquid flux to a temperature greater than 300° C. to melt the sealing material and join the two elements to one another.

2. The method of claim 1, wherein the surface area of said second wettability area is at least one and a half times greater than the surface area of said first wettability area.

3. The method of claim 2, wherein the width of said second wettability area is greater than the width of said first wettability area.

4. The method of claim 1, wherein one of the elements comprises a semiconductor substrate.

5. The method of claim 4, wherein said semiconductor substrate is a wafer including one or more active components.

6. The method of claim 1, wherein one of the elements comprises a cover.

* * * * *